US012713561B2

(12) United States Patent
Lunsman et al.

(10) Patent No.: US 12,713,561 B2
(45) Date of Patent: Aug. 18, 2026

(54) COOLING INTERFACE FOR A PLUGGABLE MODULE

(71) Applicant: HEWLETT PACKARD ENTERPRISE DEVELOPMENT LP, Spring, TX (US)

(72) Inventors: Harvey John Lunsman, Chippewa Falls, WI (US); Michael Dustin Scott, Chippewa Falls, WI (US); Ernesto J. Ferrer, Aguadilla, PR (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 220 days.

(21) Appl. No.: 18/591,149

(22) Filed: Feb. 29, 2024

(65) Prior Publication Data

US 2025/0280515 A1 Sep. 4, 2025

(51) Int. Cl.
*H05K 7/20* (2006.01)

(52) U.S. Cl.
CPC .................................. *H05K 7/2039* (2013.01)

(58) Field of Classification Search
CPC .. G02B 6/4269; G02B 6/4261; G02B 6/4268; G02B 6/4284; G02B 6/4271; G02B 6/4246; G02B 6/3897; G06F 1/20; G06F 2200/201; G06F 1/186; H05K 7/20418; H05K 7/2049; H05K 7/2039; H05K 7/20; H05K 7/20254; H05K 7/20409; H05K 9/0058; H05K 2201/066; H05K 7/20145; H05K 1/0203; H05K 2201/06; H05K 7/20281; H05K 7/20436; H05K 7/20336; H05K 7/20445; H05K 7/20509; H01L 23/40; H01L 23/4093; H01L 2023/4081; H01L 2023/4087; H01L 23/367; H01L 23/4338; H01R 12/722; H01R 13/533; H01R 12/716; H01R 13/5025; H01R 13/508; H01R 13/518; H01R 25/006; H01R 43/26; H01R 13/6591; H04B 1/036;

(Continued)

(56) References Cited

U.S. PATENT DOCUMENTS

| | | | | |
|---|---|---|---|---|
| 6,816,376 B2 * | 11/2004 | Bright | .................. | G02B 6/4201 165/185 |
| 7,355,857 B2 * | 4/2008 | Pirillis | ................. | H05K 9/0058 361/689 |

(Continued)

OTHER PUBLICATIONS

Extended European Search Report and Search Opinion received for EP Application No. 24186893.4, mailed on Dec. 13, 2024, 13 pages.

*Primary Examiner* — Michael A Matey
(74) *Attorney, Agent, or Firm* — Jones Burke, PLLC

(57) ABSTRACT

A cage for receiving a pluggable module comprises a plurality of plates including a lower plate, an upper plate, a left side plate disposed between the lower plate and the upper plate, and a right side plate disposed between the lower plate and the upper plate opposite the left side plate. A bay is defined by the plurality of plate and is sized to receive a pluggable module. The cage further includes one or more cooling interface modules. Each cooling interface module of the one or more cooling interface modules comprises a gap pad and a protective cover and is disposed such that the gap pad is adjacent to a given plate of the plurality of plates and the protective cover is adjacent to the bay.

20 Claims, 9 Drawing Sheets

(58) Field of Classification Search

CPC . H04B 10/40; F16B 2/18; F16B 2/185; F16B 2/20; F16B 2/22; F16B 2/24; F16B 2/241; F28D 15/0275; F28D 15/0233; F28F 2275/18; F28F 3/06; G11B 33/1426

See application file for complete search history.

(56) References Cited

U.S. PATENT DOCUMENTS 8,670,236 B2 * 3/2014 Szczesny ............. H05K 9/0009 174/358
10,117,357 B2 * 10/2018 Bai .................... H05K 7/20536
10,765,038 B1 * 9/2020 Leigh ................. H05K 7/20772
11,784,434 B2 * 10/2023 Yang .................... H05K 7/2039 439/607.23
2002/0114139 A1 * 8/2002 Bash .................. H05K 7/20772 361/709
2011/0002103 A1 * 1/2011 Lee ...................... H05K 7/2039 361/704
2014/0153248 A1 * 6/2014 Yeh ......................... F21V 29/70 362/294
2014/0160679 A1 * 6/2014 Kelty ................... G02B 6/4269 361/700
2014/0321061 A1 * 10/2014 Moore .................. B32B 27/281 361/709
2017/0133794 A1 * 5/2017 Hinkle ................. H01R 12/721
2018/0338387 A1 * 11/2018 Park ...................... G02B 6/4284
2019/0121404 A1 * 4/2019 Wu ...................... H05K 7/2029
2019/0273340 A1 * 9/2019 D'Inca ................. G02B 6/4271
2020/0015385 A1 * 1/2020 Bucher ................ H05K 5/0286
2020/0275587 A1 * 8/2020 Chopra ................ H05K 9/0058
2021/0235597 A1 * 7/2021 Chopra ................ G02B 6/4269
2022/0052474 A1 * 2/2022 Chiu ......................... G02B 6/42
2022/0104401 A1 * 3/2022 Yen .................... H05K 7/20472
2022/0413238 A1 * 12/2022 Chen .................... G02B 6/4277
2023/0378686 A1 * 11/2023 Bucher ..................... G06F 1/20
2024/0224470 A1 * 7/2024 Lai ....................... H05K 1/0203
2025/0133702 A1 * 4/2025 Fu ........................... F16B 2/248

* cited by examiner 510
522-2
526-1
522-1
524-1
524-2
526-2
514
518
526-3
522-3
524-3
50-1
50-2
516
513
515
517
512
513
515
50-3

510
522-2
514
516
518
522-1
522-3
512

510
524-2

526-2
514
516
518
524-1
524-3
526-1
526-3
512

510
516
518
526-1
526-3
50
50
50b
50b
50a
50a
512

900
934
40-2
40-3
40-1
40-4
936-2
936-1
910-1
910-2
928

900

934
40-2
40-3
40-1
910-1
40-4
936-2
936-1
932-1
910-2
932-1
928

COOLING INTERFACE FOR A PLUGGABLE MODULE

Computer systems generate heat during operation and, if the heat is not dissipated or cooling is not provided, damage can occur to various components within the system. Cooling systems come in a variety of forms, but all cooling systems help provide temperature control to allow the computer system, and the constituent components thereof, to continue functioning without damage.

BRIEF DESCRIPTION OF THE DRAWINGS

The present disclosure can be understood from the following detailed description, either alone or together with the accompanying drawings. The drawings and related description of the figures are included to provide a further understanding of the present disclosure and are incorporated in and constitute a part of this specification. The drawings illustrate one or more nonlimiting aspects and implementations of the present teachings and together with the description explain certain principles and operation. In the drawings.

DETAILED DESCRIPTION

Figure 1:
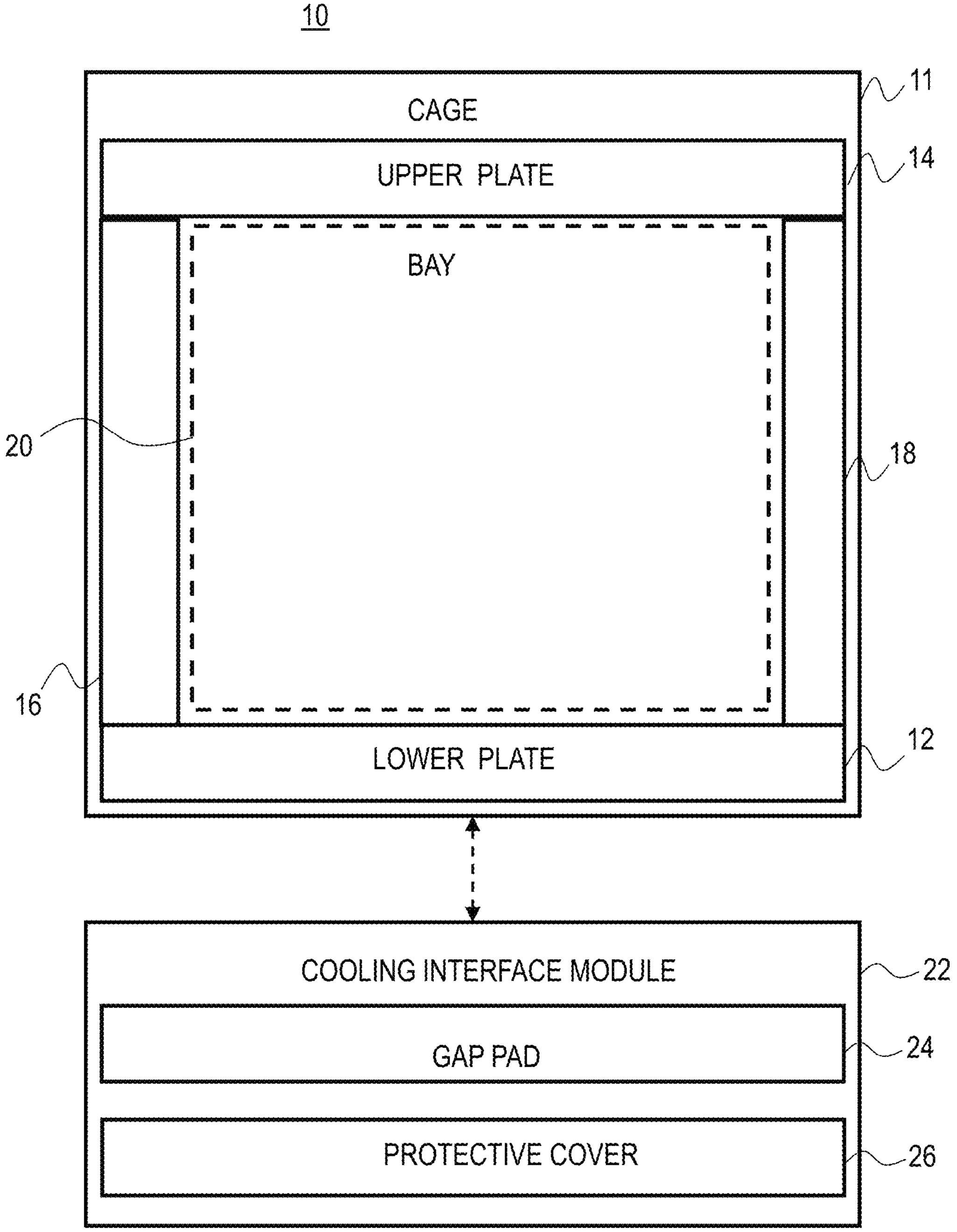
FIG. 1 is a diagram of an example receptacle for a pluggable module consistent with the present disclosure.

Cooling systems are an important aspect of a computer, as without an adequate cooling system, the heat generated by the computer or server system may cause damage to components contained therein. One way of cooling is through liquid cooling, whereby heat is dissipated through absorption into a liquid coolant circulating through a liquid cooling system. Generally, the heat reaches the coolant through a liquid cooled cold plate that is thermally coupled to the component being cooled as well as to the liquid coolant. As used herein, a liquid cooled cold plate (hereinafter "cold plate") refers to a device which receives heat from a solid body via conduction and dissipates the heat into a liquid coolant that is either in direct contact with the cold plate (e.g., flowing through an interior chamber thereof) or flows through a pipe or tube that is in contact with the cold plate.

Often, computer systems include pluggable modules (e.g., an optical transceiver) in addition to components that are more permanently installed (e.g., a motherboard). The pluggable modules are designed to be easily insertable and removable into a receptacle of the computing system, usually in a hot pluggable manner. The receptacle may include a cage which defines an opening, referred to herein as a bay, in which the pluggable module is received. The pluggable modules, like other components of the system, generate heat and need to be cooled. However, although cooling pluggable modules in an air-cooled system is relatively straightforward, in a computing system which is cooled primarily or exclusively by liquid cooling, it can be a challenge to cool pluggable modules due to the removable/pluggable nature of the modules. To transfer heat from the pluggable modules into the liquid coolant, a thermal interface needs to be established between the two. But, because the pluggable modules are designed to be easily insertable and removable, the approaches which are often used for cooling other components may not be suitable for the pluggable module. For example, it is typical to attach a cold plate to a central processing unit (CPU) to provide liquid cooling thereto, but attaching such a cold plate to a pluggable module would interfere with the ability to easily insert or remove the pluggable module.

One approach to providing liquid cooling to pluggable modules is to arrange a cold plate (or a thermal transfer device coupled to the cold plate) in the receptacle that receives the pluggable module such that the cold plate or thermal transfer device makes contact with the pluggable module as the pluggable module is inserted into the receptacle. However, ensuring a sufficiently high rate of heat transfer with such a thermal interface can be challenging. In particular, the surfaces which are to contact one another are generally not perfectly smooth and may not be perfectly aligned, which can lessen heat transfer rates. Surface smoothness and alignment could be improved, for example by specifying stricter tolerances, but doing so may increase costs and may also make inserting/removing modules more difficult.

One approach to increasing the heat transfer rate in spite of the surface roughness and misalignment is to add a thermal interface material (TIM) between the pluggable module and the cold plate or thermal transfer device. As used herein, a TIM refers to a relatively thin, thermally conductive, and compliant material placed between two devices at their thermal interface to improve heat transfer rates. The TIM can fill in the gaps between the mating surfaces (caused by, e.g., surface roughness or misalignment), thus improving heat transfer. However, one problem with this approach is that as a pluggable module is inserted or removed into a receptacle, sliding contact between the pluggable module and the TIM may occur and can result in damage to and/or removal of the TIM. For example, if the TIM is a gap pad, the sliding contact may tear or rub off the gap pad. Or, if the TIM is a thermal grease or paste, the sliding contact may wipe off the TIM. Thus, the damaged or removed TIM may not be effective at improving heat transfer. Furthermore, even if the TIM remains effective for one, or a few, insertions/removals, it may wear away eventually and thus may need to be reapplied periodically, which increases costs and complexity. In addition, some thermal greases or pastes can be quite messy, with the potential to spill out during insertion or to leave a residue on the removed pluggable module after removal. Thus, while the use of a TIM can improve thermal performance, there may be some drawbacks.

Another approach is to use a dry thermal interface between the module and the cold plate thermal transfer device, with "dry thermal interface" meaning a direct-contact interface with no TIM between the two contacting surfaces. With such interfaces, a relatively high contact pressure may need to be applied between the contacting surfaces in order to compensate for the roughness and/or misalignment thereof. However, achieving high contact pressures may require the user to supply a large amount of force when inserting and/or removing the pluggable modules. Generally, the amount of force a user can comfortably supply for insertion/removal is limited. In some circumstances, the amount of contact pressure needed to achieve a desired high heat transfer rate may require insertion/removal forces which exceed the limits of what the user can comfortably supply. Thus, in some systems, insertion/removal forces may be limited to a level deemed acceptable to the average user, but as a result, the pluggable modules will have a limited amount of contact pressure with the cold plate or thermal transfer device and a correspondingly lower rate of heat transfer. In other words, to keep the module easily insertable and removable, heat transfer rates may be sacrificed. Thus, with a dry thermal interface, it is difficult to obtain both good thermal performance and easy insertion/removal.

The present disclosure addresses these issues by providing a receptacle which receives the pluggable module with one or more cooling interface modules which are configured to provide a dry thermal interface with the pluggable module capable of achieving both high heat transfer rates and low insertion/removal forces. Each cooling interface module comprises a thermal gap pad with a thin protective cover attached thereto, with the protective cover being formed from a thermally conductive material which is relatively robust (e.g., strong, hard, ductile) such as a thin metal sheet. Moreover, each cooling interface module is movably coupled to a cage of the receptacle (the cage defining the bay into which the module is inserted) such that, as the pluggable module is received into the bay, the pluggable module directly contacts and moves the protective cover, which compresses the thermal gap pad between the protective cover and the cage. Elastic restoring forces in the compressed thermal gap pad push the protective cover against the pluggable module, which conforms the protective cover to the pluggable module and alleviates any initial misalignment between the surfaces. This ensures a relatively good thermal interface, which allows heat to be transferred at a high rate from the pluggable module into the liquid cooling loop via a path comprising the protective cover, the thermal gap pad, and the cage wall. Moreover, the contact pressure between the protective cover and the pluggable modules is relatively moderate, thus avoiding the need for high insertion or removal forces. In addition, because the protective cover is what contacts the pluggable module during insertion and removal, the protective cover prevents the thermal gap pad from being damaged or removed by insertion and/or removal of the pluggable module.

In some examples, the receptacle of the present disclosure comprises a connector cage with three cooling interface modules, each comprising metal-lined gap pads, integrated with the top and side plates of the connector cage. The gap pads are sandwiched between the connector cage and the thin metal plate which lines the gap pad.

When a pluggable module is inserted into the receptacle, it slides and pushes against the thin metal plate. Because the gap pad has some "springiness" and can be compressed, the pluggable module pushing against the thin metal plate also compresses the gap pad. However, the spring force created by insertion of the pluggable module causes the gap pad to want to return to its original, uncompressed state. Thus, once the pluggable module is inserted, the gap pad pushes the thin metal plate against the pluggable module, causing the thin metal plate to conform to the pluggable module. This interference fit is what creates thermal coupling between the pluggable module and the cooling interface.

The connector cage of the receptacle is further thermally coupled to a cold plate of a cooling system. In some examples, the connector cage is directly coupled to the cold plate, i.e., the cold plate is located directly on top of the connector cage. In other examples, the cold plate is remotely located; in these examples, the heat generated by the pluggable module is conducted to the cold plate via thermal transfer devices, such as heat pipes. Regardless of the location of the cold plate, the thermal coupling of the connector cage to the cold plate allows the connector cage, and thus the pluggable module, to be integrated into the existing cooling system for the computing system.

FIG. 1 is a schematic diagram of an example receptacle 10 for receiving a pluggable module consistent with the present disclosure. It should be understood that FIG. 1 is not intended to illustrate specific shapes, dimensions, or other structural details accurately or to scale, and that implementations of the receptacle 10 may have different numbers and arrangements of the illustrated components and may also include other parts that are not illustrated. In FIG. 1, physical connections (e.g., physical attachment and/or support) are indicated conceptually by dashed lines.

As shown in FIG. 1, the receptacle 10 comprises a cage 11 and one or more cooling interface modules 22. The receptacle 10 may be installed in an information processing system (e.g., a computing system, networking device, etc.) and when so installed may provide an interface to receive a pluggable module and electrically connect a pluggable module to other components of the information processing system, such as a system board.

The cage 11 is formed by a plurality of plates, namely, a lower plate 12, an upper plate 14, a left side plate 18, and a right side plate 16, with both the left side plate 18 and the right side plate 16 being disposed between the lower plate 12 and the upper plate 14. The plates 12, 14, 16, and 18 comprise generally planar structures that form walls of the cage 11, and are arranged such that they are all parallel to a first direction, with lower plate 12 and upper plate 14 being parallel to each other and with right side plate 16 and left side plate 18 being parallel to each other and perpendicular to lower plate 12 and upper plate 14. In other words, the plates 12, 14, 16, and 18 are coupled together to form a box-like shape (i.e., a hollow rectangular prism). In some examples, the plates 12, 14, 16, and 18 are formed from one or more pieces of sheet metal which has been machined (e.g., bent, stamped, etc.) to form the shape of the cage 11. In some examples, some or all of the plates 12, 14, 16, and 18 are integrally connected to (i.e., part of the same monolithic body as) others of the plates 12, 14, 16, and 18. In some examples, some or all of the plates 12, 14, 16, and 18 are formed as separate parts which are joined together by mechanical fasteners, welding/brazing, or other fastening techniques.

The cage 11 also has a bay 20 defined by the plates 12, 14, 16, and 18 in the empty space located between the plates 12, 14, 16, and 18. Bay 20 may be sized to receive a pluggable module, such as an optical transceiver or other pluggable module. The cage 11 has at least one opening into the bay 20 through which the pluggable module can be inserted into the bay 20. As described previously, a pluggable module is a component of a computer system that is designed to be selectively engaged or used, in contrast to more permanently installed components. A pluggable module is designed to be easily insertable and removable into a bay, such as bay 20.

Although not illustrated, an electrical connector may also be disposed in or immediately adjacent to the bay 20 such that, when the pluggable module is installed in the bay 20, a connector of the pluggable module can mate with the electrical connector of the receptacle 10. The electrical connector may be connected to other components of an information processing system, such as a system board. In some examples, the electrical connector is part of the receptacle 10. In other examples, the electrical connector is part of the system in which the receptacle 10 may be installed.

Although four plates are shown in FIG. 1, examples are not so limited, and fewer plates may be used. For example, a cage could be formed from an upper plate and two side plates, omitting the lower plate, and some other structure separate from the cage, such as a surface to which the cage is attached, could define a boundary of the bay in lieu of the lower plate.

The cage 11 may be formed from a thermally conductive material, such as copper, a copper alloy, nickel, steel, stainless steel, aluminum, or an aluminum alloy. Good thermal conductivity allows the cage 11 to efficiently transfer heat from a pluggable module received in the bay 20 to a cooling subsystem (not illustrated) which may be thermally coupled to the cage 11. In addition to their good thermal conductivity, the aforementioned materials may also be beneficial for use in the cage 11 because they are electrically conductive, which can help contain electromagnetic interference (EMI), and structurally robust, which can allow the cage 11 to withstand repeated insertions and removals of the pluggable module and to provide support to the pluggable module when installed therein. In some examples, the entirety of cage 11 may be formed from one material, such as copper. In other examples, a combination of materials may be used to form cage 11. For example, in some implementations, the upper plate 14 of cage 11 may be made of copper due to copper having a high degree of thermal conductivity, such that the upper plate 14 is primarily responsible for thermal conductivity between the pluggable module and the other components of the system. Meanwhile, the left side plate 18 and the right side plate 20 may be made of a material with a lower degree of thermal conductivity, such as aluminum or stainless steel. The lower plate 12 may also be made of the less thermally conductive material, or may be made of copper, similar to the upper plate 14. Examples are not so limited, however, and any combination of materials for the plurality of plates may be used to achieve a desired level of thermal conductivity of the cage 11.

At least one cooling interface module 22 is coupled to the cage 11. Although only one cooling interface module 22 is shown in FIG. 1, examples are not so limited and more cooling interface modules 22 may be used. The cooling interface module 22 may comprise a gap pad 24 and a protective cover 26. As used herein, a gap pad refers to a particular type of thermal interface material (TIM) that is thermally conductive and relatively compliant, meaning that the gap pad may compress and conform to the surfaces between which it is placed. The gap pad may have a compression rate of between ten and fifty percent, and preferably has a compression rate of around twenty percent.

The cooling interface module 22 may further include a protective cover 26. As used herein, a protective cover refers to a piece of material designed to protect the gap pad when the cooling interface module 22 is in use. The protective cover may be made of a low-friction, thermally conductive material that is also both conforming and tear-resistant. The protective cover 26 is attached to one face of the gap pad 24, for example via adhesive. In some examples, the protective cover 26 covers the entirety of the face of the gap pad 24. In some examples, the protective cover 26 also extends beyond the edges of the gap pad 24 in one or more directions. In some examples, the protective cover 26 includes attachment features which assist in attaching the cooling interface module 22 to the receptacle 10.

Each cooling interface module 22 is coupled to a corresponding plate of the receptacle 10, such that, when coupled to receptacle 10, the gap pad 24 is sandwiched between the protective cover 26 and the plate 26. The cooling interface module 22 protrudes into the bay 20, with the protective cover 26 facing a central region of the bay 20. Thus, when a pluggable module is inserted into the bay 20, the pluggable module makes contact with the cooling interface module 22. More particularly, the pluggable module slides along the protective cover 26 during insertion and removal of the pluggable module. The gap pad 24 is thereby protected from damage caused by the pluggable module.

In some examples, each cooling interface module 22 may be coupled to the corresponding plate by a mechanical attachment feature which retains the cooling interface module on the cage 11 while also allowing for the movement of the cooling interface module 22 in response to insertion of the pluggable module. For example, the mechanical attachment feature may include a hook at one end of the cooling interface module 22 which engages with the end of the corresponding plate. In some examples, each cooling interface module 22 may be coupled to the corresponding plate by adhesion between the gap pad 24 and the corresponding plate, which may be used in addition to or in lieu of the mechanical attachment feature. In some examples, the adhesion may be provided by a natural tackiness of the gap pad 24 itself. In other examples, the adhesion may be provided by an adhesive which is added between the gap pad 24 and the plate.

During insertion of the pluggable module, the gap pad 24 is compressed by the force of the insertion (i.e., by contact with the pluggable module). This compression occurs because the free space in the bay 20 (i.e., the unoccupied space in the middle portion of the bay 20, which is bounded by the protective covers 26 of the cooling interface module(s) 22 and by those of the plates 12, 14, 16, or 18 which lack a cooling interface module (if any)) is slightly smaller in cross-section than the pluggable module, and thus the pluggable module necessarily must move the protective covers 26 in a generally radially outward direction (i.e., towards the plates) in order to make room for itself. This radially outward motion of the protective covers 26 compresses the gap pads 23. In addition, the protective cover 26 is deformed by the pressure between the pluggable module and the compressed or deformed gap pad 24. As a result, the protective cover 26 conforms to the shape of the surface of the pluggable module, resulting in an improved thermal interface between the cooling interface module 22 and the pluggable module. Thus, when the pluggable module is installed into bay 20, a thermally conductive pathway is formed from the pluggable module to the cage 11 via the cooling interface module.

As noted above, the protective cover 26 may be made from a relatively low-friction, thermally conductive, conformable, and durable (tear resistant) material. For example, the protective cover 26 may have a coefficient of static friction less than 1.5, a thermal conductivity greater than 5 w/mK, and a tensile strength greater than 10000 psi. It is noted that the conformability and thermal conductivity of the protective cover 26 may depend not only on the intrinsic qualities of the material used to form the protective cover 26, but also on the thickness of the protective cover 26. For example, a relatively thin protective cover 26 may have a higher conductivity and greater conformability than a relatively thicker protective cover 26 of the same material. Many metals can be made into relatively thin sheets, foils, or films while retaining good tear resistance, and also tend to have good thermal conductivity and conformability (particularly when formed into a thin sheet or film). Thus, in some examples, the protective cover may be a thin metal sheet, foils, or film, such as a sheet, foil, or film made of copper, a copper alloy, nickel, steel, stainless steel, aluminum, an aluminum alloy, or a combination thereof. In such examples, the average thickness of the protective cover 26 may be as small as 0.0008 inches (0.020 millimeters) or, depending on the material, up to 0.006 inches (0.152 millimeters).

In particular, in some examples the protective cover 26 is copper and the average thickness thereof may be around 0.003 inches (0.076 millimeters). Copper has excellent thermal conductivity, which helps improve thermal transfer through the protective cover 26. In addition, copper is highly malleable, which allows the cover 26 to easily conform to the surface of the pluggable module when pressed against it by the restoring forces of the compressed gap pad 24, and this conforming of the cover 26 to the pluggable module improves the thermal interface therebetween and thus further improves the rate of heat transfer.

In other examples, the protective cover 26 is stainless steel, and the average thickness thereof may be around 0.001 inches (0.025 millimeters). Stainless steel has excellent durability, which allows it to be made thinner than other materials while still resisting tearing during insertion/removal of the pluggable module. This thinness allows for high thermal conductivity and conformability of the protective cover 26. In particular, although stainless steel may have lower intrinsic thermal conductivity than copper, the ability to make the protective cover 26 thinner can offset the lower intrinsic thermal conductivity of the steel and produce comparable (in some cases, better) overall conductivity through the thermal interface module 22.

Although metals in general, and copper and stainless steel in particular, are good candidates for the materials of the protective cover 26, examples are not so limited. In other examples, the protective cover may be manufactured from a thermally conductive plastic or other thermally conductive non-metallic material, such as thermally conductive tape. Regardless of the material, protective cover 26 may be disposed adjacent to gap pad 24 so as to protect gap pad 24 when a pluggable module is engaged.

In some examples, additional elements are attached to the protective cover 26 on the same side thereof as the gap pad 24. For example, a plurality of gap pads, including the gap pad 24, may be attached to the same side of the protective cover 26. In some examples in which a plurality of gap pads are attached to the same protective cover, some of gap pads may have different material properties than others.

For example, in some implementations, one or more of the gap pads may have relatively high thermal conductively but may be less springy (i.e., produce relatively lower restoring (spring) forces when compressed), whereas one or more others of the gap pads may have relatively lower thermal conductivity but be more springy (i.e., produce relatively higher restoring (spring) forces when compressed). In such implementations, the springy gap pads may be added to aid in pushing the protective cover 26 against the pluggable module to ensure conformation thereof and a good thermal interface, whereas the high thermal conductivity gap pads may be provided to provide good heat conduction from the protective cover 26 to the cage 11.

Figure 2:
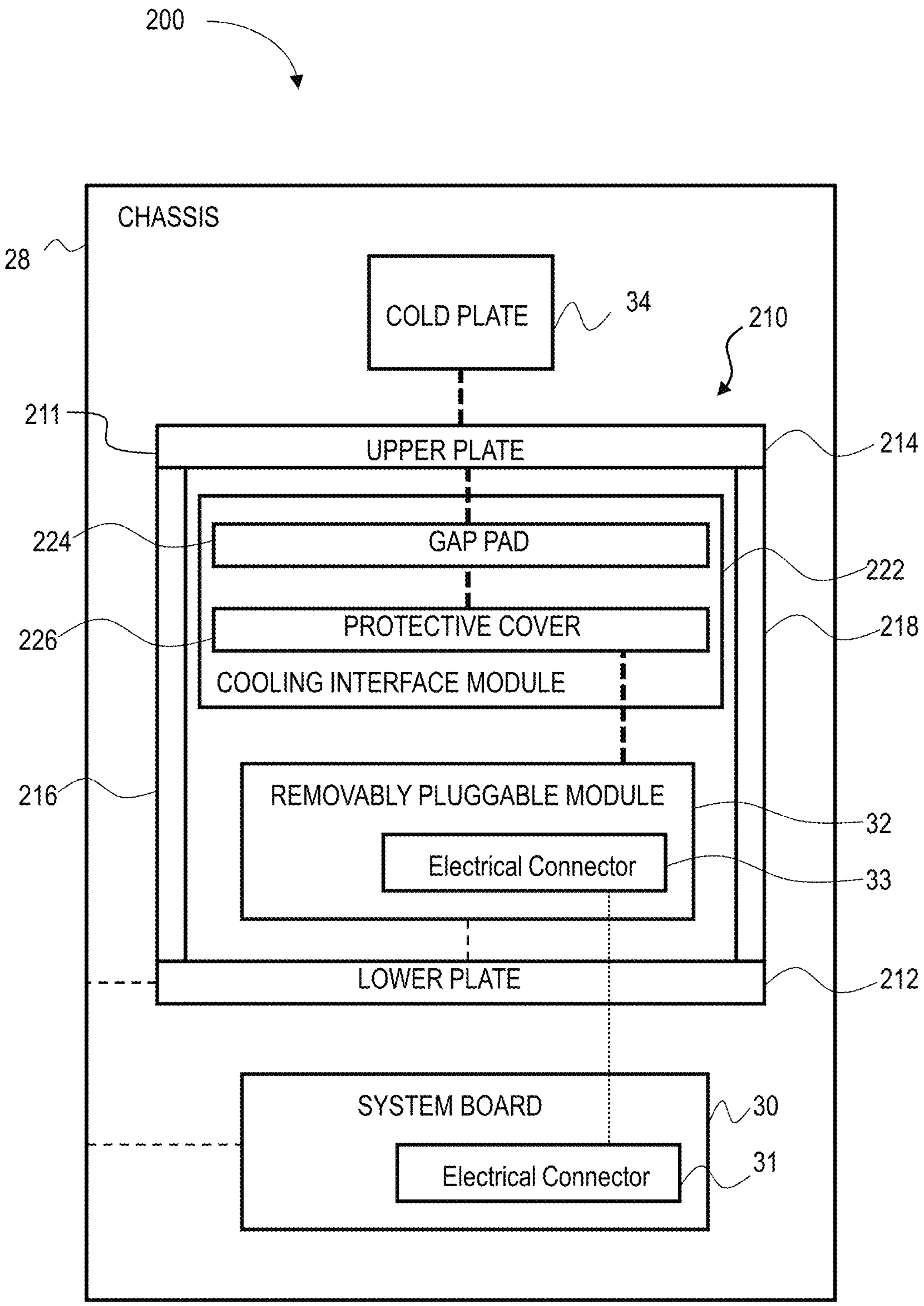
FIG. 2 is a diagram of an example information processing system including a receptacle for a pluggable module consistent with the present disclosure.

FIG. 2 is a diagram of an example information processing system 200 ("system 200") including a receptacle 210 for a pluggable module consistent with the present disclosure. The receptacle 210 is one example implementation of the receptacle 10 described above in relation to FIG. 1, and similar reference numbers with the same last two digits (e.g., 111 and 211) are used for components of the receptacle 210 which correspond to (e.g., are example implementations of) components of the receptacle 10 which were already described above. In FIG. 2, physical coupling (e.g., contact, attachment, support, etc.) are indicated by dashed lines, and electrical connections are indicated by dotted lines. System 200 may be, for example, a computing system (e.g., server), networking system (e.g., switch), or other information processing system.

System 200 includes a chassis 28 and a system board 30 supported by and/or housed within the chassis 28. System 200 further includes a receptacle 210 and a removably pluggable module 32.

System board 30 may be a printed circuit board assembly, or PCA, which may be housed in and/or supported by chassis 28. In some examples, system board 30 may include a printed circuit board, or PCB, and one or more electronic components mounted thereto, such as a processor, memory, or other components.

The receptacle 210 comprises a cage 211 which may be coupled to or form a part of the chassis 28. Similar to the receptacle 10 described in relation to FIG. 1, the receptacle 210 may include cage 211 formed by a plurality of plates; namely, a lower plate 212, an upper plate 214, and a plurality of side plates 216, 218 to couple the lower plate 212 to the upper plate 214. In some examples, a given one of the plates may be coupled with, or may be part of, the chassis 28. For example, in FIG. 2 the lower plate 212 is shown as being coupled with the chassis 28. In some examples, the given plate (e.g., the lower plate 212) may be a separate plate that is attached to the chassis 28, for example by welding, mechanical fasteners, adhesive, or any other suitable fastening mechanism. In other examples, the given plate (e.g., the lower plate 212) may be integrally formed with the chassis 28. Said differently, the given plate 212 be part of a wall, panel, or other structure of the chassis 28, such that a separately attached plate is not present.

The receptacle 210 also includes one or more cooling interface modules 222, which are disposed within and attached to the cage 211. Cooling interface module 222 may include a gap pad 224 and a protective cover 226. The cooling interface module 222 may be disposed along, and coupled to, a plate of the plurality of plates. FIG. 2 shows the cooling interface module 222 disposed along and coupled to the upper plate 214; however, examples are not so limited and the cooling interface module 222 may be disposed along the lower plate 212 or one of the plurality of side plates 216, 218. In addition, although only one cooling interface module 222 is shown in FIG. 2, more than one cooling interface module 222 may be used. In such examples, each cooling interface module 222 may be disposed along a plate. For example, a first cooling interface module 222 may be disposed adjacent to a first plate of the plurality of plates 212, 214, 216, 218, and a second cooling interface module 222 may be disposed adjacent to a second plate of the plurality of plates 212, 214, 216, 218. In some examples, a third cooling interface module may be further included and may be disposed adjacent to a third plate of the plurality of plates 212, 214, 216, 218.

As described with respect to FIG. 1, the cooling interface module 222 includes a gap pad 224 and a protective cover 226. As shown in FIG. 2, when installed in system 200, the gap pad 224 may be disposed adjacent to (e.g., in contact with) the plate, in this case, upper plate 214. The gap pad 224 may have a level of tackiness inherent to the material that may help the gap pad 224 be held into place with respect to the upper plate 214. In addition, the protective cover 226 may have an attachment mechanism, such as a hook, to couple the cooling interface module 222 to the cage 211. This attachment mechanism is discussed further herein with respect to FIG. 5.

The protective cover 226 may be coupled to the gap pad 224 such that protective cover 226 and gap pad 224 are movable as a single unit. For example, protective cover 226 may be affixed to gap pad 224 by adhesive. When installed in cage 211, protective cover 226 may be disposed opposite from the plate that the gap pad 224 is engaged with, e.g., the upper plate 214 in the example of FIG. 1. Said differently, cooling interface module 222 may be installed within cage 211 so that the gap pad 224 is sandwiched between one of the plates (e.g., upper plate 214) and protective cover 226.

This configuration may be used to create a thermal interface between a removably pluggable module 32 and the cage 211 when the pluggable module 32 is inserted into the cage 211. More specifically, the cooling interface module 32 protrudes into the bay 220 defined by the cage 211 such that, when the pluggable module 32 is inserted into the bay 220, the pluggable module 32 makes contact with the protective cover 226, as indicated by dashed lines in FIG. 2. Moreover, as the pluggable module 32 is inserted, it presses the protective cover 226 towards the corresponding plate of the cage 211 (e.g., upper plate 214 in FIG. 2), thus compressing the gap pad 224 between the protective cover 226 and the cage plate. The gap pad 224 resists compression and generates spring-like forces which push the protective cover 226 against the pluggable module 32. This generates contact pressures which improve a conductivity of a thermal interface between the pluggable module 32 and the protective cover 226. In particular, in some examples the protective cover 226 is sufficiently malleable that the pressure causes it to conform to a surface of the pluggable module 32, thus producing a good thermal interface therebetween notwithstanding the lack of a thermal interface material. In this state, pluggable module 32 is in contact with protective cover, which is in contact with gap pad, which is in contact with a plate of the cage 211 (e.g., with upper plate 214 in FIG. 2), and therefore a conductive pathway is formed from the pluggable module 32 to the cage 211. In other words, in this state, heat flows from the removable pluggable module 32 into the protective cover 226, from the protective cover into the gap pad 224, and from the gap pad 224 into the cage 211.

A cold plate 34 may be thermally coupled to the cage 211. As described previously, a cold plate receives heat from a solid body via conduction and dissipates the heat into a liquid coolant, cooling the solid body to which the cold plate is connected. As used herein, two items are "thermally coupled" if: (1) they are in contact with one another, or (2) they are both in contact with a thermally conductive thermal transfer device (or thermally conductive chain of thermally coupled thermal transfer devices), or (3) a heat transfer coefficient between the two items is 10 W·m−2·K−1 or less. Notably, "contact" includes both direct contact and indirect contact in which a thermally conductive intermediary material, such as a TIM, is present. The cold plate 34 may be part of a liquid cooling loop which flows liquid coolant through the system 200 to cool components thereof. In addition to the cold plate 34, the liquid cooling loop may include additional cold plates (not illustrated) to cool other components, such as a processor of system board 20, as well as other liquid cooling infrastructure (not illustrated), such as coolant lines, valves, fittings, etc.

Figure 3:
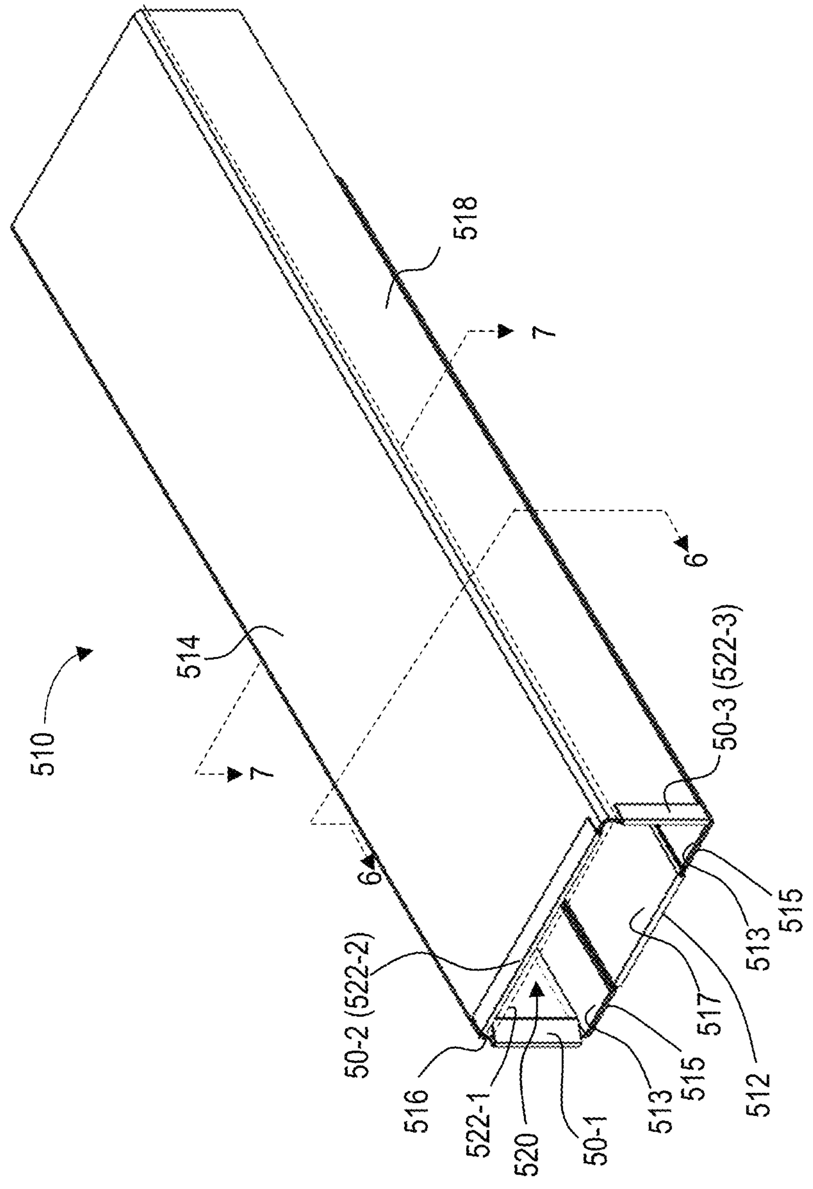
FIG. 3 is a perspective view of an example receptacle for a pluggable module consistent with the present disclosure.
Figure 4:
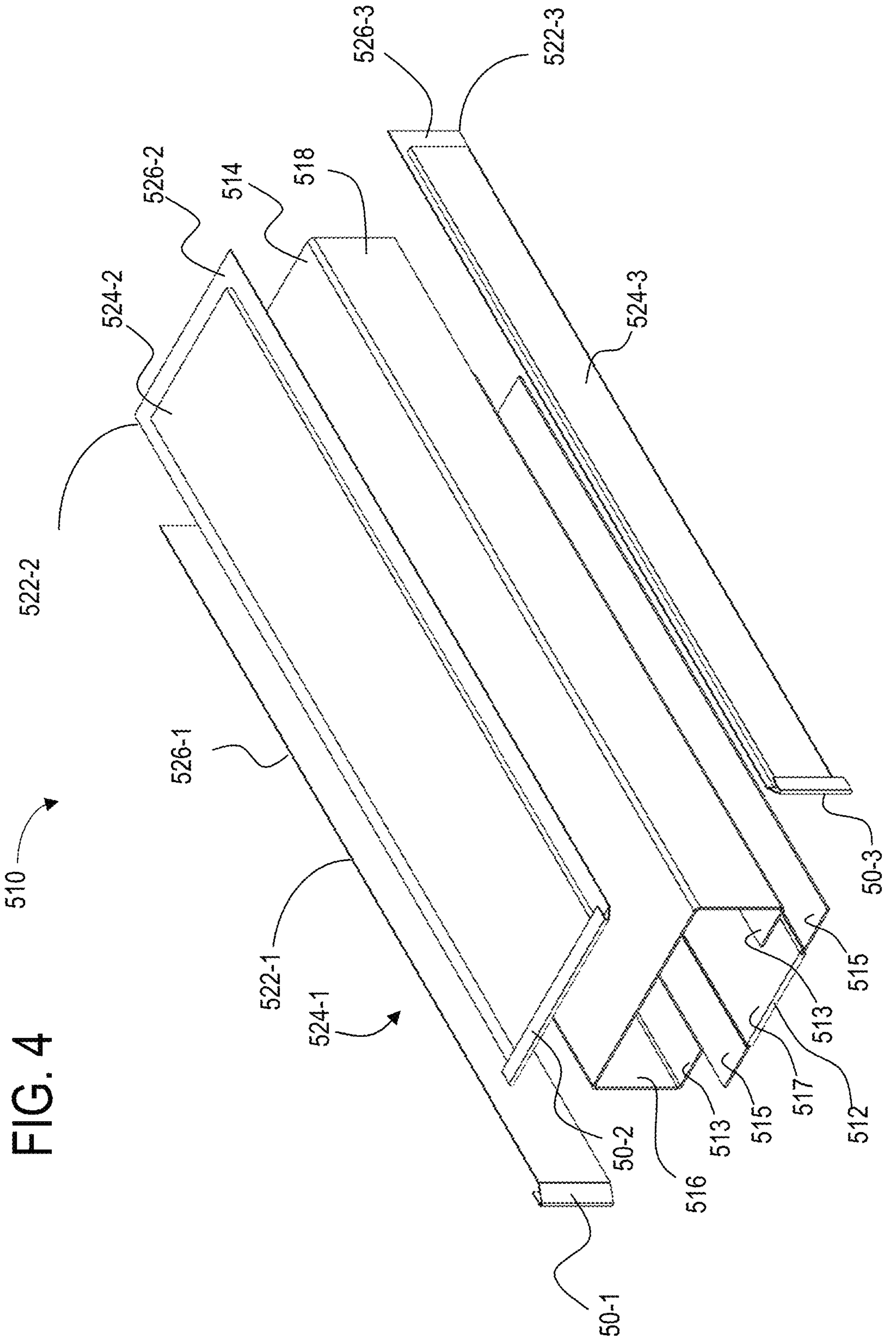
FIG. 4 is an exploded perspective view of the receptacle of FIG. 3.

In some examples, the cold plate 34 may be directly coupled with cage 211, such that the cold plate 34. FIG. 3 shows an example of such direct coupling. In other examples, the cold plate 34 may be remotely located from cage 211. In such examples, thermal transfer devices, such as heat pipes, may be used to thermally couple cage 211 to the cold plate 34. A thermal transfer device is any thermally conductive device configured to transfer heat from one object thermally coupled thereto across some distance to another object thermally coupled thereof. Examples of thermal transfer devices include heat pipes, vapor chambers, a bar of copper (or other conductive material), etc. FIG. 4 shows an example of such a configuration. Because cold plate 34 is thermally coupled with the cage 211 (either directly, or via thermal transfer devices), the heat transferred into the cage 211 from the removable pluggable module 32 can be transferred into the cold plate 34, and from there into the liquid coolant which removes the heat from the system 200. In other words, a thermal pathway is established from the pluggable module 32 to the cold plate 34 via the cooling interface module 222 and the cage 211. This thermal path is indicated in FIG. 2 by the thick dashed lines. In examples in which the receptacle 210 has multiple cooling interface modules 222, multiple thermal paths similar to the aforementioned may be established to convey heat from the pluggable module 32 to the cold plate 34, with each such thermal path going through one of the modules 222 and a corresponding plate of the cage 211 with which that module 222 is in contact.

Turning now to FIGS. 3-7, an example receptacle 510 for receiving a pluggable module will be described. The receptacle 510 is one example implementation of the receptacles 10 and 210 described above. Some components of the receptacle 510 correspond to (e.g., are example implementations of) components of the receptacle 10 or 210, and such corresponding components are given similar reference numbers with the same last two digits (e.g., 511, 211, and 11). Although the receptacle 510 of FIG. 3 is one example implementation of the receptacles 10 and 210, the receptacles 10 and 210 are not limited to the receptacle 510.

As shown in FIGS. 3-7, receptacle 510 comprises a cage 511 and three cooling interface modules 522. The cage 511 may be formed from a lower plate 512, an upper plate 514, a left side plate 516, and a right side plate 518. In FIG. 4, lower plate 512 is shown as offset from upper plate 514, left side plate 516, and right side plate 518; however, in use, lower plate 512 is coupled thereto to form cage 511.

Figure 5:
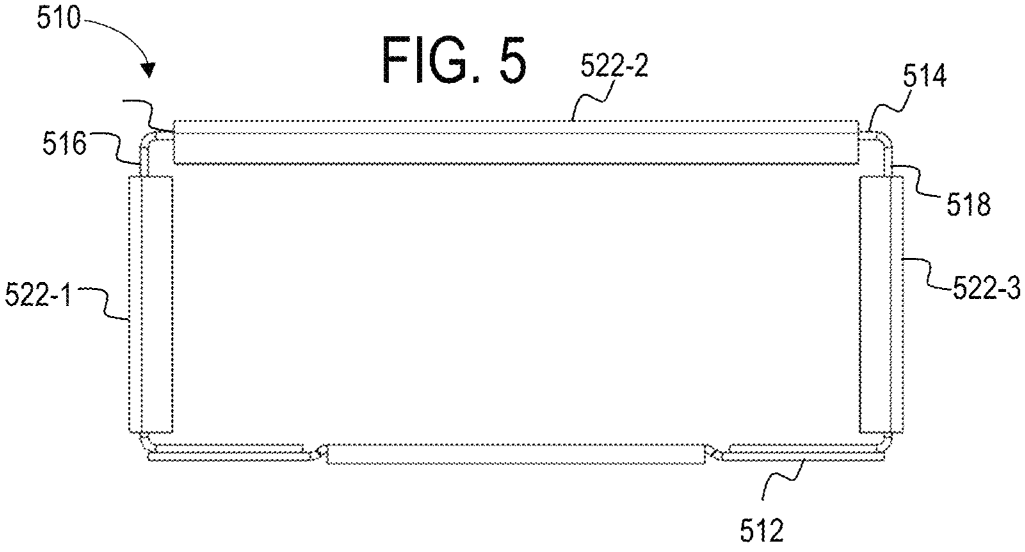
FIG. 5 is a front view of the receptacle of FIG. 3.
Figure 6:
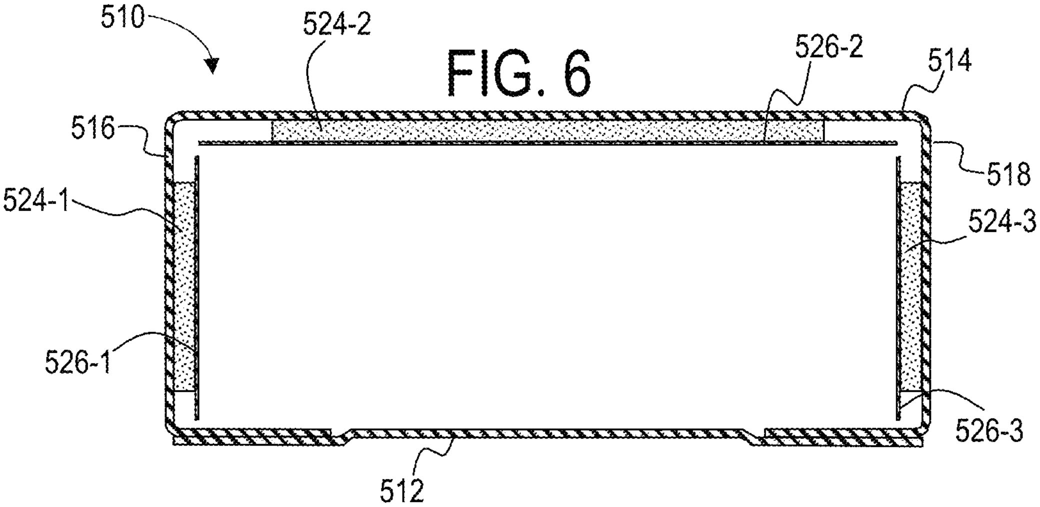
FIG. 6 is a cross-sectional view of the receptacle of FIG. 3, with section taken along line 6-6.
Figure 7:
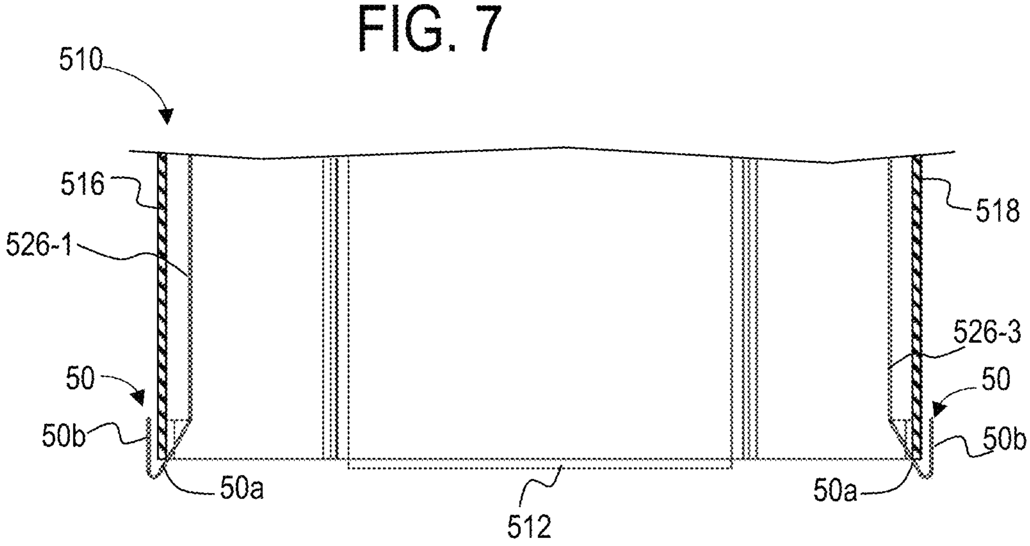
FIG. 7 is a cross-sectional view of the receptacle of FIG. 3 with section taken along line 7-7.

More specifically, in this example, upper plate 514, a left side plate 516, and a right side plate 518 are integrally connected together (i.e., part of the same monolithic body). For example, a sheet of metal which may be bent into the structure comprising the plates 512, 514, and 516 which is shown in FIG. 4, and then subsequently the lower plate 512, which is a separate piece, is attached to this structure (e.g., by welding, brazing, etc.) to complete the cage 511. To facilitate this attachment of the lower plate 512 to the other plates 512, 514, and 516, flanges 513 are provided which are integrally connected to the left and right plates 516 and 518. The flanges 513 are bent perpendicular to the left and right plates 516 and 518 so as to be parallel to the lower plate 512, thus providing a relatively large surface area which can be connected to the lower plate 512. In some example, to avoid having the flanges 513 stick out into the bay 520, the lower plate 512 may be provided with recessed or thinned regions 515 which receive the flanges 513, such that a top surface of the flanges 513 are aligned (e.g., coplanar) with the top surface of a central portion 517 of the lower plate 512, as shown in FIGS. 5 and 6.

In other examples, plates 512, 514, 516, and 518 may all be integrally connected. In other examples, plates 512, 514, 516, and 518 may each be formed separately and then joined later.

In the example of FIGS. 2-7, the receptacle includes three cooling interface modules 522-1, 522-2, 522-3 (collectively, cooling interface modules 522). Importantly, while three cooling interface modules 522 are shown, examples are not so limited and other numbers of cooling interface modules 522 may be used. As shown in FIG. 3, each cooling interface module 522 is disposed adjacent to and is coupled with a corresponding one of the plates 512, 514, 516, and 518. Note that in the exploded view of FIG. 4, the cooling interface modules 522 are shown external to their respective plates of cage 511; that is, cooling interface modules 522 are shown outside cage 510, and not in their installed positions. When installed, cooling interface module 522-1 is disposed along left side plate 516, cooling interface module 522-2 is disposed along upper plate 514, and cooling interface module 522-3 is disposed along right side plate 518.

Each cooling interface module 522 includes a gap pad, such as gap pads 524-1 to 524-3 (collectively, gap pads 524). It is to be noted that, although not shown in FIG. 4, cooling interface module 522-1 would have a similar gap pad 524-1, which is visible in FIG. 6. The gap pads 524 are disposed adjacent to a protective cover, such as protective cover 526-1, 526-2, 526-3 (collectively, protective cover 526). In addition, each cooling interface module 522 includes a protective cover 526 that, as discussed with respect to FIG. 1, is designed to protect the gap pad 524.

As shown in FIGS. 3-5 and 7, a hook 50-1, 50-2, 50-3 (collectively, hook 50) is attached to one end of the protective cover 526 of a respective cooling interface module 522. Each hook 50 includes a ramp portion 50*a* that extends at an angle away from protective cover 526. Specifically, each ramp portion 50*a* protrudes generally forward from the protective cover 526 and away from a center of the bay 520. Each hook 50 also includes a cutback portion 50*b* which extends generally rearward from the end of the ramp portion 50*a*, extending back over at least part of the ramp portion 50*a*, and in some cases also over part of the protective cover 526. The cutback portion 50*b* may, in some examples, extend parallel to the protective cover 526. In this manner, an opening is formed into which a plate of cage 511 is able to be received (between cutback portion 50*b* and ramp portion 50*a*), allowing cooling interface module 522 to be connected to cage 510. More particularly, hook 50 may allow cooling interface module 522 to be connected to an edge of cage 511 in a manner that still allows the cooling interface module 522 to move relative to the cage 511, such as by pivoting about the hoot 50. In some examples, the hook 50 is integrally connected to the protective cover 526—for example, the hook 50 and cover 526 may be formed from a same piece of metal sheet or foil which has been bent to from the structure shown in FIGS. 3-7. In some examples, the hook 50 may be formed from a thicker material than the protective cover 526. In other examples, the hook 50 and protective cover 526 have similar thicknesses.

In some examples, the ramp portion 50*a* of hook 50 that extends upwardly and away from protective cover 526 provides a sloped or ramped surface which forms a portion of the rim or perimeter of an opening of the bay 520. These sloped or ramped surfaces form lead-in surfaces which are arranged to contact a pluggable module as the pluggable module is being inserted and to guide the pluggable module into the bay 520. In addition, the sloped surfaces allow for a gradual transition from a first state in which the pluggable module is not in contact with the protective covers 526 and the gap pads 524 are not compressed to a second state in which the pluggable module is sliding along the protective covers 526 with the gap pads 524 compressed.

Figure 8A:
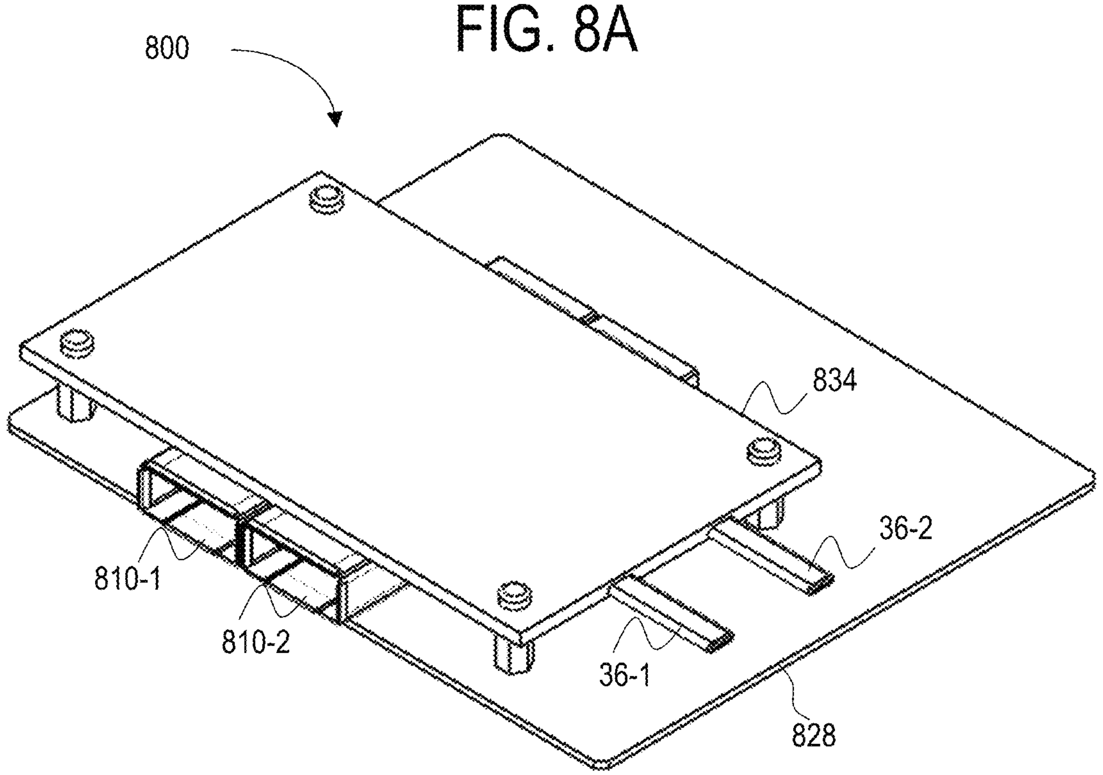
FIG. 8A is a perspective view of an example system comprising a receptacle and a directly coupled cold plate for a pluggable module consistent with the present disclosure.
Figure 8B:
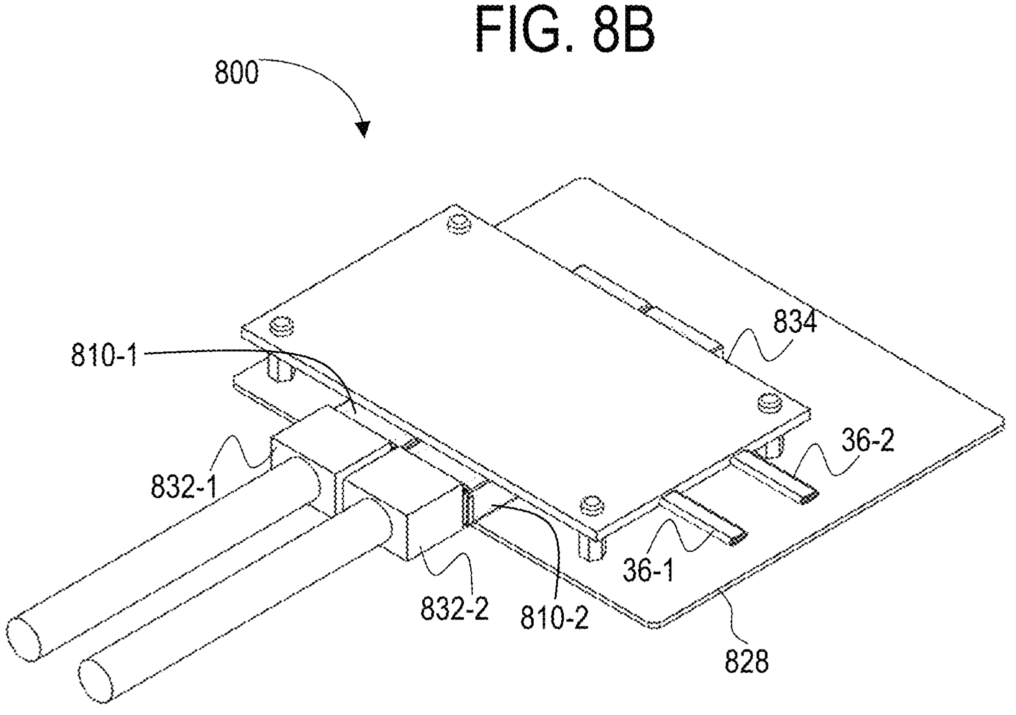
FIG. 8B is a perspective view of the system of FIG. 8A in a state of a pluggable module being installed.

Turning now to FIGS. 8A and 8B, FIG. an example system 800 including receptacles and a directly coupled cold plate for a pluggable module will be described. FIG. 8B is a perspective view of the system of FIG. 8A in a state of a pluggable module being installed. Two receptacles 810-1, 810-2 (collectively receptacles 810) are shown, although examples are not so limited and more or fewer receptacles may be present. System 800 is one example implementation of system 200 described above. Some components of the system 800 correspond to (e.g., are example implementations of) components of the system 200, and such corresponding components are given similar reference numbers with the same last two digits (e.g., 832 and 32). Although the system 800 of FIGS. 8A and 8B are one example implementation of the system 200, the system 200 is not limited to system 800.

In some examples, the system 800 may be a computing system, such as a server. That is, the system 800 may comprise a printed circuit board assembly (PCA) 828, which is either a primary system board of the computing system or is a secondary board configured to be connected to the primary system board of the computing system. In some examples, PCA 828 is the primary system board and comprises a sockets to receive a processor and memory.

As shown in FIG. 8A, a cold plate 834 is disposed atop and coupled to receptacles 810. Two pipes 36-1, 36-2 (collectively, pipes 36) extend from cold plate 334. Pipes 36 facilitate movement of liquid coolant, allowing heat generated when a pluggable module is inserted into receptacles 310 to be dissipated. The pipes 36 and cold plate 834 are part of a liquid cooling loop which cools system 800. The liquid cooling loop may also include a pump and other liquid cooling infrastructure (not shown) which circulate liquid coolant, as would be familiar to those of ordinary skill in the art. The pipes 36 are arranged in the liquid cooling loop such that one of the pipes 36 receives (directly or indirectly) liquid coolant from a coolant source (e.g., a heat exchanger) and supplies the liquid coolant to the cold plate 834, and the other one of the pipes 36 returns (directly or indirectly) the liquid coolant to the heat source. In some examples, the pipes 36 are fluidically coupled to an interior chamber within cold plate 834 through which the liquid coolant circulates, with one pipe 36 supplying the liquid coolant into the chamber and the other pipe 36 receiving outflows of the liquid coolant from the chamber. In such examples, the liquid coolant directly contacts the interior surfaces of the cold plate 834. In other examples, the pipes 36 are portions of the same single pipe (or pipe network) which extends through the cold plate 834, such that the liquid coolant does not directly contact the cold plate 834 but instead contacts the pipe walls which in turn contact the cold plate 834.

FIG. 8B shows the system 800 of FIG. 8A in a state of the pluggable modules 832-1, 832-2 (collectively, pluggable modules 832) inserted into the receptacles 810. In this state, the pluggable modules 832 contact the cooling interface modules of the receptacles 810 and therefore a thermally conductive pathways is established between the pluggable modules 832 and the liquid coolant flowing through the cold plate 834, with the thermally conductive pathways going from pluggable module 832 to the cooling interface modules, from cooling interface modules to the cage of the receptacle 810, from the cage of the receptacle 810 into the cold plate 834, and from the cold plate 834 into the liquid coolant (either directly, or via walls of the pipes 36). System 800 may also include electrical connectors (not shown) which are disposed at a rear of each receptacle 810 and electrically connected to PCA 828, such that, in the inserted state shown in FIG. 8B, the pluggable module 832 mate with the electrical connectors and are electrically connected to PCA 828 thereby.

Figure 9A:
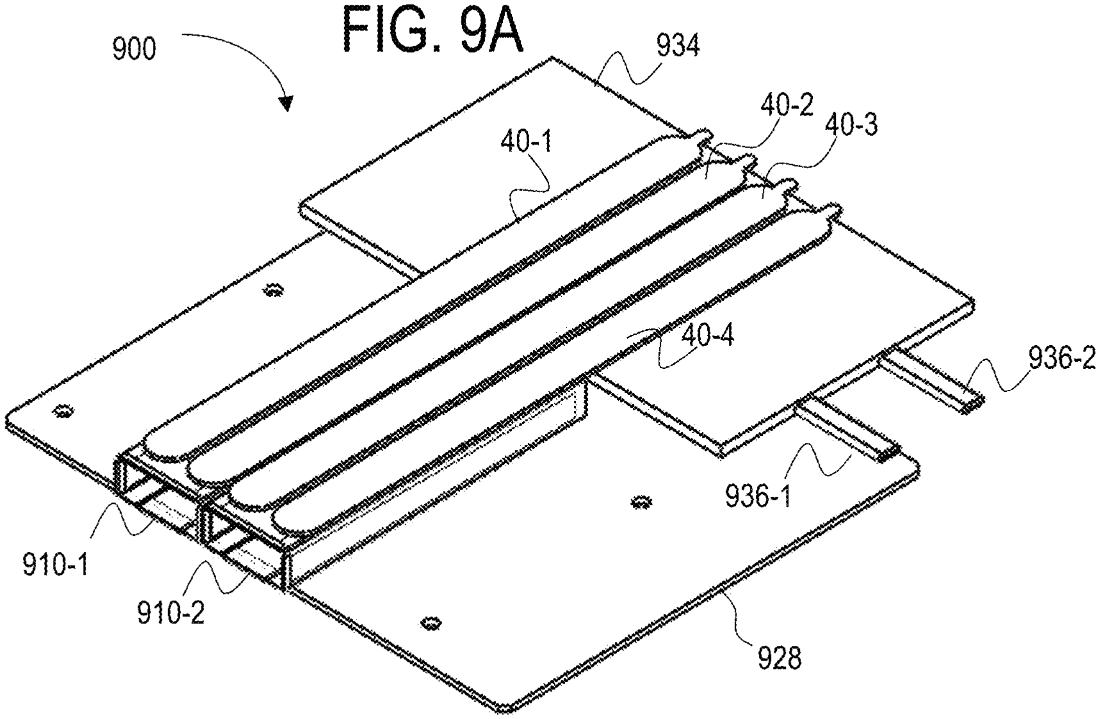
FIG. 9A is a perspective view of an example system comprising a receptacle and a remotely located cold plate for a pluggable module consistent with the present disclosure.
Figure 9B:
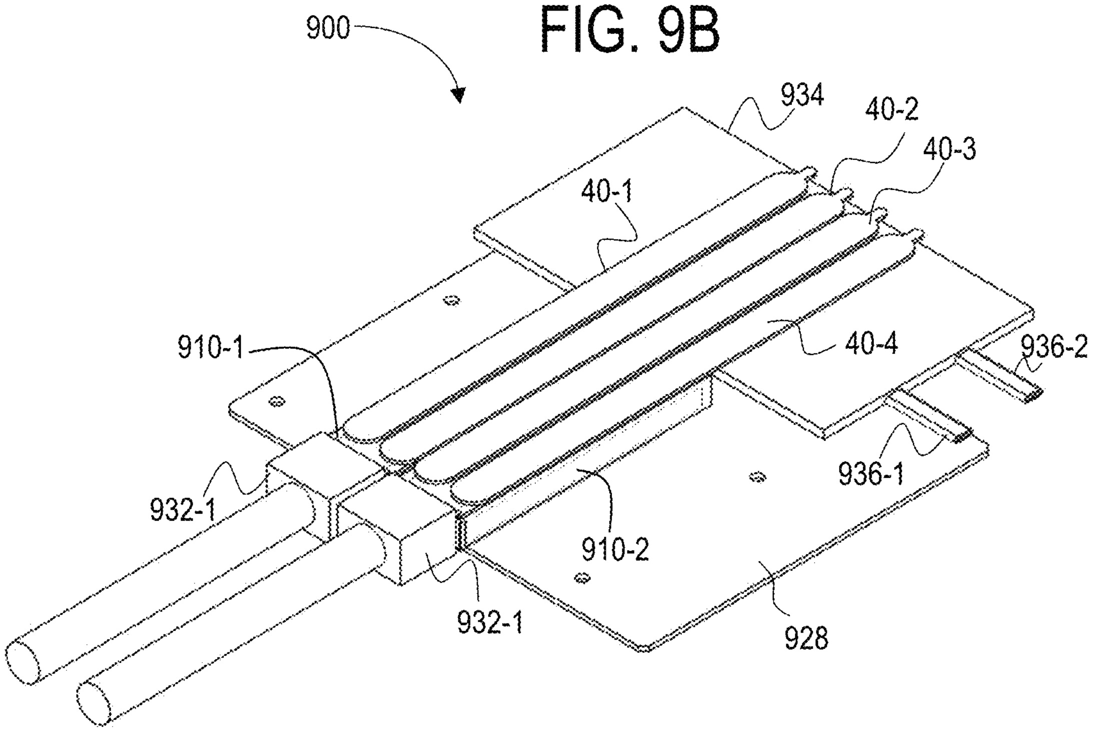
FIG. 9B is a perspective view of the system of FIG. 9A in a state of a pluggable module being installed.

FIGS. 9A and 9B show an example system 900 including receptacles and a remotely located cold plate for a pluggable module. FIG. 9B is a perspective view of the system of FIG. 9A in a state of a pluggable module being installed. Two receptacles 910-1, 910-2 (collectively receptacles 910) are shown, although examples are not so limited and more or fewer receptacles may be present. System 900 is one example implementation of system 200 described above. Some components of the system 900 correspond to (e.g., are example implementations of) components of the system 200, and such corresponding components are given similar reference numbers with the same last two digits (e.g., 932 and 32). Although the system 900 of FIGS. 9A and 9B are one example implementation of the system 200, the system 200 is not limited to system 900. The system 900 may be similar to the system 800, except that in the system 900, cold plate 934 is not directly in contact with the receptacles 910, but is instead remotely located, as described in greater detail below.

Like system 800, system 800 may be a computing system, such as a server, and comprises a PCA 928. This PCA 928 may be either a primary system board of the computing system or a secondary board configured to be connected to the primary system board of the computing system. In some examples, PCA 928 is the primary system board and comprises a sockets to receive a processor and memory.

As shown in FIGS. 9A and 9B a plurality of heat pipes 40-1, 40-2, 40-3, 40-4 (collectively heat pipes 40) are coupled to receptacle 910 and to cold plate 934. The heat pipes 40 comprise a hollow interior in which is disposed a working fluid and a wicking structure which are configured to transfer heat along the longitudinal direction of the heat pipe 40 by a repeating cycle of evaporation, convection, condensation, and wicking. That is, heat is absorbed by a liquid phase portion of the working fluid at the hot end (the end which is connected to receptacle 910) resulting in evaporation of the heated working fluid into a vapor phase, the vapor phase working fluid then moves through convection to the cool end (the end which is connected to cold plate 934) whereupon the vapor phase working fluid condenses back into a liquid phase and in so doing releases heat into the cold plate 934, and then the now condensed liquid phase is wicked back to the hot end to begin the cycle again. In this manner, heat is absorbed at the hot end of each heat pipe 40 and transported to the cool end thereof, thus transporting heat out of the receptacles 910 and into the cold plate 934. In other examples, heap pipes 40 may be replaced by other types of thermal transfer devices, which may include any thermally conductive device which can transfer heat between receptacles 910 and cold plate 934. For example, a thermal transfer device may include a sold piece of thermally conductive material, such as copper or another thermally conductive metal. Thus, the heat generated by the pluggable modules 932 inserted into receptacles 910 reaches the cold plate 934 through the thermal connection between the receptacles 910, the heat pipes 40 (or other thermal transfer device used in lieu of the heat pipes 40), and the cold plate 934. Cold plate 934 includes a plurality of pipes 936-1, 936-2 (collectively, pipes 936). Pipes 936 circulate liquid coolant through cold plate 934, causing heat pipes 40 to be cooled and thus transferring the cooling to receptacle 910. The cold plate 934 and pipes 936 may be configured similarly to the cold plate 834 and pipe 836 described above.

Figure 10:
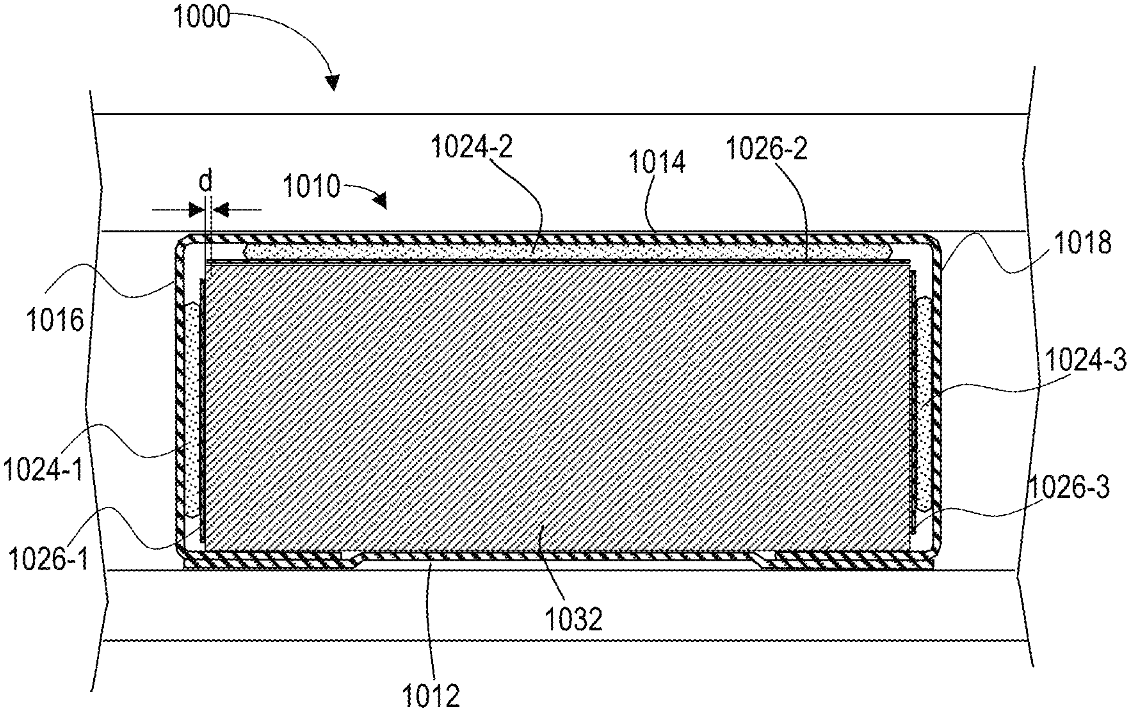
FIG. 10 is a front view of an example system including receptacle in a state of a pluggable module being installed consistent with the present disclosure.

FIG. 10 is a front view of an example system 1000 including a receptacle 1010 in a state of a pluggable module 1032 being installed consistent with the present disclosure. System 1000 is one example implementation of system 200 described above. Some components of the system 100 correspond to (e.g., are example implementations of) components of the system 200, and such corresponding components are given similar reference numbers with the same last two digits (e.g., 1010 and 210). Although the system 1000 of FIG. 10 is one example implementation of the system 200, the system 200 is not limited to system 1000.

As shown in FIG. 10, system 1000 comprises a receptacle 1010, a pluggable module 1032, a cold plate 1034, and a base 1028. The receptacle 1010 is an implementation example of the receptacle 10 described above and comprises a cage 1011 and one or more cooling interface modules 1022 coupled to the cage. Each cooling interface module 1022 comprises a protective cover 1026 and a gap pad 1024. In some examples, the receptacle 1010 may have the same configuration as the receptacle 510 described above, as shown in FIG. 10 as one illustrative example. In other examples, the receptacle 1010 may have a different configuration, such as having more or fewer cooling interface modules 1022 and/or a differently shaped cage 1011.

In some examples, the base 1028 is a PCA, such as a primary system board or secondary board of a computing system (e.g., similar to the PCA 828 or 928). In other examples, the base 1028 is a mechanical support, such as a wall the chassis of a computing system. The cage 1011 is coupled to the base 1028.

In the illustrated example, the cold plate 1034 is in direct contact with the cage 1011, specifically a top plate 1014 thereof, similar to the arrangement illustrated in FIGS. 8A and 8B, however in other examples the system 1000 may have a remotely located cold plate 1034, similar to the arrangement illustrated in FIGS. 9A and 9B, in which case heat pipes (or other thermal transfer devices) would be in contact with the cage 1011 instead of the cold plate 1034.

As shown in FIG. 10, the pluggable module 1032 is received in the cage 1011 within the opening defined by lower plate 1012, upper plate 1014, left side plate 1016, and right side plate 1018 of the cage 1011. Further, the pluggable module 732 is in contact with protective covers 1026-1, 1026-2, 1026-3 (collectively, protective covers 1026). Protective covers 1026, in turn, are coupled to gap pads 1024-1, 1024-2, 1024-3, respectively (collectively gap pads 1024).

Insertion of pluggable module 1032 into receptacle 1010 results in a thermal connection being created between the receptacle 1010 and the pluggable module 1032. When pluggable module 1032 is inserted into receptacle 1010, each of the gap pads 1024 compresses by some amount. When pluggable module 1032 is inserted into receptacle 1010, the pluggable module 1032 contacts the protective cover 1026 and pushes the protective cover 1026 away from a centerline of cage 1011, i.e., in a generally radially outward direction. Specifically, the cover 1026-1 is pushed in the +x direction shown in FIG. 10, cover 1026-2 is pushed in the +y direction shown in FIG. 10, and cover 1026-3 is pushed in the −y direction. In FIG. 10, the movement of cover 1026-1 relative to its resting position prior to insertion of the pluggable module 1032 is indicated by distance d (i.e., the pluggable module 1032 pushed the cover 1026-1 a distance d in the +x direction while being inserted). The movement of the covers 1026 away from the centerline of the cage 1011 compress the gap pads 1024 which are sandwiched between the covers 1026 and the cage 1011. In other words, inserting the pluggable module 1032 into receptacle 1010 pushes against the protective cover 1026 such that the gap pad 1024 compresses during the insertion process.

The compression of the gap pads 1024 causes them to generate internal elastic restoring forces which urge the gap pads 1024 back towards their uncompressed state, similar to a spring force generated by a spring under compression. These restoring forces push are applied to the protective covers 1026 in a direction opposite that of the compression—e.g., the restoring force of gap pad 1024-1 pushes cover 1026-1 in the −x direction, the restoring force of gap pad 1024-2 pushes cover 1026-2 in the −y direction, and the restoring force of gap pad 1024-3 pushes cover 1026-3 in the +x direction. Consequently, the restoring force of a given gap pad 1024 is able to push the corresponding protective cover 1026 back against the pluggable module 1032, which generates a contact pressure between the protective cover 1026 and the pluggable module 1032 maintains a contact therebetween. Said differently, the protective cover 1026 is pushed into full contact with the pluggable module 1032 by the restoring force of the gap pad 1024, such that a thermal interface is created. Moreover, in some examples, protective covers 1032 may be sufficiently compliable/conformable that the restoring forces cause the protective covers 1026 to deform and comply to the outer surface of the pluggable module 1032. This may allow for the number and size of air gaps at the interface between the pluggable module 1032 and the protective cover 1026 to be reduced, or in other words for the total area of mutual contact to be increased, which improves the rate of heat transfer across the thermal interface. In some examples, the restoring force from the gap pads 1024 is sufficiently strong to achieve a good thermal interface but not so strong as to require overly large insertion forces. For example, in some implementations a thermal interface between pluggable module and cage may transfer heat at a rate of at least 0.10 $W/cm^2C$ and the insertion forces required to insert the pluggable module 1032 into the receptacle 1010 may be no more than 25 lbf. In some examples, the pressure generated due to the restoring forces of the compressed gap pads 1024 may be between 5 lbf and 25 lbf when the gap pads 1024 are compressed. The gap pad 1024, thus, serves the dual purpose of transferring heat from the protective covers 1026 to the cage 1011 and applying contact pressure between protective cover 1026 and pluggable module 1032 to assist the protective cover 1026 in creating a thermal connection between the receptacle 1010 and the pluggable module 1032.

In some examples where gap pads 1024 and protective covers 1026 are in use, gap pads having different properties may be utilized. For example, different gap pads have different levels of thermal conductivity and different degrees of springiness and compressibility. Compressibility refers to the degree to which the gap pad compresses when subjected to a given amount of pressure and is inversely related to the degree to which the gap pad resists compression. That is, a highly compressible gap pad may lightly resist compression and thus may be compressed more for a given applied pressure, whereas a less compressible gap pad may more strongly resist compression and thus may be compressed less for a given applied pressure. Consequently, a gap pad that is more compressible will generate a lower restoring spring force when compressed by a given amount as compared to a less compressible gap pad compressed by the same amount. In other words, highly compressible gap pads tend to produce lower restoring forces and less compressible gap pads produce greater restoring forces, all other things being equal. It may be the case that a gap pad with a high degree of thermal conductivity has a higher degree of compressibility than a gap pad with a lower degree of thermal conductivity. Such a high thermal conductivity and high compressibility gap pad might generate a weak contact pressure between the protective cover 1026 and the pluggable module 1032, which can result in a poor thermal interface between cover 1026 and module 1032. Thus, the overall thermal conductivity of the cooling interface module 1022 may be poor, notwithstanding the high thermal conductivity of the gap pad. On the other hand, a gap pad with lower thermal conductivity may have higher compressibility and thus may generate a higher contact pressure between cover 1026 and module 1032. Thus, such a low conductivity low compressibility gap pad may improve the thermal interface between the protective cover 1026 and module 1032, but the low thermal conductivity of the gap pad itself may create a thermal bottleneck which reduces the overall thermal conductivity of the module 1022. Thus, in some examples, to ensure that the cooling interface modules 1022 achieve a desired level of overall thermal conductivity, different gap pads having different degrees of thermal conductivity and compressibility may be mixed together with the modules 1022. For example, a given module 1022 may be provided with multiple gap pads 1024 attached to the same protective cover 1026, including one or more gap pads 1024 with high thermal conductivity and high compressibility to ensure highly conductive thermal pathway between cover 1026 and cage 1011, and one or more gap pads 1024 with lower thermal conductivity and lower compressibility to ensure sufficient contact pressure is applied between protective cover 1026 and module 1032. These different gap pads 1024 may be arranged in various patterns on the protective cover 1026, such as a pattern with the highly conductive gap pad(s) 1024 arranged in a middle region and the less conductive gap pad(s) 1024 surrounding the highly conductive gap pads, or a pattern in which highly conductive gap pads 1024 and less conductive gap pads 1024 are arranged in alternating positions of an array (such as a checkerboard pattern).

In some other examples, a first gap pad with a high degree of thermal conductivity may be installed adjacent to one plate. Additional gap pads having a lower degree of thermal conductivity but greater compressibility may be installed adjacent to other plates. Because each gap pad is compressed when a pluggable module 1032 is inserted into receptacle 1010, the gap pads having greater compressibility will generate a lower restoring force than the less compressible gap pads.

In addition, in some examples, additional compressible materials may be coupled to the gap pad 1024 and/or the protective cover 1026. In such examples, the additional compressible material may be used to increase the amount of restoring force pushing the protective cover against the pluggable module 1032. This may aid in creating a good thermal interface between the pluggable module 732 and receptacle 1010.

Figure 11:
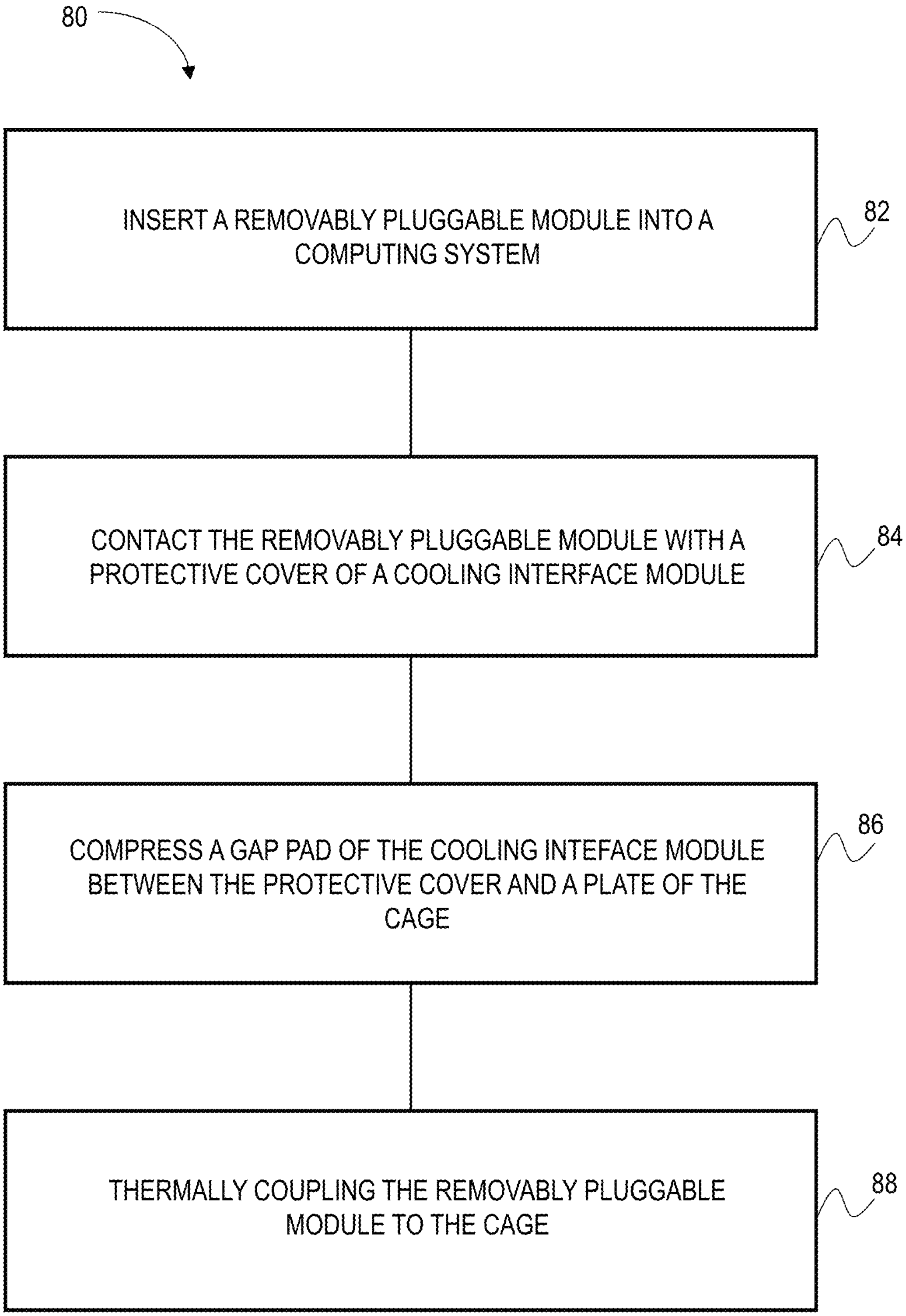
FIG. 11 is a process flow chart illustrating an example method for use of a cooling interface for a pluggable module consistent with the present disclosure.

FIG. 11 is an example method 80 for use of a cooling interface for a pluggable module consistent with the present disclosure. At 82, method 80 may include inserting a removably pluggable module into a receptacle of a computing system. As described previously, the receptacle may be designed to receive a removably pluggable module within a bay defined by a plurality of walls. The receptacle may be coupled with the computing system or may be integrally formed as part of a component of the computing system, such as formed as part of a chassis.

At 84, method 80 may include contacting the removably pluggable module with a protective cover of a cooling interface module attached to the receptacle. As described previously-, the receptacle may include at least one cooling interface module coupled to a plate of the receptacle. The cooling interface module may comprise a protective cover, such as a thin metal sheet, and a gap pad, and may be coupled to the receptacle such that the gap pad is sandwiched between the receptacle and the protective cover. Thus, when the removably pluggable module is inserted into the receptacle, the removably pluggable module may be placed in contact with the protective cover.

At 86, method 80 may include compressing a gap pad of the cooling interface module. As described previously, the gap pad may have an inherent compressibility, such that when the removably pluggable module is inserted into the receptacle, the gap pad is compressed to allow the insertion. Said differently, when the removably pluggable module contacts the protective cover during insertion into the receptacle, the gap pad may also compress to allow the removably pluggable module to be fully inserted into and received by the receptacle.

At 88, method 80 may include thermally coupling the removably pluggable module to the receptacle by causing the gap pad to push the protective cover against the removably pluggable module. As described with respect to FIG. 10, because the gap pad undergoes compression when the removably pluggable module is inserted into the cage, a restoring force moves the gap pad back towards its uncompressed state once the removably pluggable module is fully inserted. Because the gap pad is attached to the protective cover, the restoring force of the gap pad has the effect of also pushing the protective cover against the removably pluggable module. As described previously, particularly with respect to FIG. 1, the protective cover is made of a thermally conductive material and, since the gap pad is also thermally conductive, the contact between the outer portion of the receptacle, the gap pad, the protective cover, and the removably pluggable module results in a thermal connection between the removably pluggable module and the receptacle.

The receptacle may be thermally coupled to a cold plate of the computing system. As discussed with respect to FIGS. 2, 8A-8B and 9A-9B, the cold plate may be either directly coupled to the receptacle or may be remotely located such the receptacle is thermally coupled to the cold plate by, for example, heat pipes. However, in either configuration, the thermal coupling of the removably pluggable module to the receptacle results in the removably pluggable module being thermally coupled to the cold plate. In this manner, the removably pluggable module is able to be cooled.

It is to be understood that both the general description and the detailed description provide example implementations that are explanatory in nature and are intended to provide an understanding of the present disclosure without limiting the scope of the present disclosure. Other examples in accordance with the present disclosure will be apparent to those skilled in the art based on consideration of the disclosure herein. For example, various mechanical, compositional, structural, electronic, and operational changes may be made to the disclosed examples without departing from the scope of this disclosure, including for example the addition, removal, alteration, substitution, or rearrangement of elements of the disclosed examples, as would be apparent to one skilled in the art in consideration of the present disclosure. Moreover, it will be apparent to those skilled in the art that certain features or aspects of the present teachings may be utilized independently (even if they are disclosed together in some examples) or may be utilized together (even if disclosed in separate examples), whenever practical. In some instances, well-known circuits, structures, and techniques have not been shown or described in detail in order not to obscure the examples. Thus, the following claims are intended to be given their fullest breadth, including equivalents, under the applicable law, without being limited to the examples disclosed herein.

References herein to examples, implementations, or other similar references should be understood as referring to prophetic or hypothetical examples, rather than to devices/systems that have been actually produced, unless explicitly indicated otherwise. Similarly, references to qualities or characteristics of examples should be understood as representing the educated estimates or expectations of the inventors based on their understanding of the relevant principles involved, application of theory and/or modeling, and/or past experiences, rather than as being representations of the actual qualities or characteristics of an actually produced device/system or the empirical results of tests actually carried out, unless explicitly indicated otherwise.

Further, spatial, positional, and relational terminology used herein is chosen to aid the reader in understanding examples of the invention but is not intended to limit the invention to a particular reference frame, orientation, or positional relationship. For example, spatial, positional, and relational terms such as “up”, “down”, “lateral”, “beneath”, “below”, “lower”, “above”, “upper”, “proximal”, “distal”, and the like may be used herein to describe directions or to describe one element’s or feature’s spatial relationship to another element or feature as illustrated in the figures. These spatial terms are used relative to reference frames in the figures and are not limited to a particular reference frame in the real world. Furthermore, if a different reference frame is considered than the one illustrated in the figures, then the spatial terms used herein may need to be interpreted differently in that different reference frame. Moreover, the poses of items illustrated in the figure are chosen for convenience of illustration and description, but in an implementation in practice the items may be posed differently.

In addition, the singular forms “a”, “an”, and “the” are intended to include the plural forms as well, unless the context indicates otherwise. Moreover, the terms “comprises”, “comprising”, “includes”, and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition. Moreover, unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within +1% of the stated value, property, or relationship unless indicated otherwise.

What is claimed is:

1. A receptacle for receiving a pluggable module, comprising:
- a cage comprising a plurality of plates including:
  - a lower plate;
  - an upper plate;
  - a left side plate disposed between the lower plate and the upper plate;
  - a right side plate disposed between the lower plate and the upper plate opposite the left side plate;
- a bay defined by the plurality of plates, wherein the bay is sized to receive the pluggable module; and
- one or more cooling interface modules, wherein:
  - each cooling interface module of the one or more cooling interface modules comprises:
    - a gap pad; and
    - a protective cover; and
  - each cooling interface module of the one or more cooling interface modules is disposed such that the gap pad is adjacent to a given plate of the plurality of plates and located between the protective cover and the given plate.

2. The receptacle of claim 1, wherein the protective cover is movable with respect to the given plate.

3. The receptacle of claim 1, wherein each cooling interface module of the one or more cooling interface modules further comprises a hook attached to one end of the protective cover and configured to pivotably connect the cooling interface module to an edge of the cage.

4. The receptacle of claim 1, wherein:
- a first cooling interface module of the one or more cooling interface modules is disposed adjacent to a first plate of the plurality of plates; and
- a second cooling interface module of the one or more cooling interface modules is disposed adjacent to a second plate of the plurality of plates.

5. The receptacle of claim 1, wherein the protective cover comprises a metal sheet.

6. The receptacle of claim 5, wherein:
- the metal sheet has an average thickness of 0.003 inches or less; and
- the metal sheet comprises one of copper, a copper alloy, nickel, steel, stainless steel, aluminum, an aluminum alloy, or any combination of these.

7. The receptacle of claim 1, wherein the protective cover comprises a low-friction, conforming, tear resistant, and thermally conductive material.

8. The receptacle of claim 1, wherein the protective cover is in the form of a sheet, foil, or film adhered to a face of the gap pad.

9. The receptacle of claim 8, wherein the protective cover comprises a metal sheet, foil, or film with an average thickness of 0.006 inches or less.

10. The receptacle of claim 8, wherein the protective cover is in contact with the entirety of the face of the gap pad.

11. A computing system, comprising:
- a chassis;
- a system board supported by the chassis;
- a removably pluggable module;
- a receptacle coupled to or formed by the chassis and configured to receive the removably pluggable module, wherein the receptacle comprises:
  - a cage comprising a plurality of plates including:
    - a lower plate;
    - an upper plate located opposite the lower plate; and
    - side plates coupled to the lower plate and to the upper plate; and
  - at least one cooling interface module disposed along a plate of the plurality of plates, wherein the at least one cooling interface module further comprises:
    - a gap pad; and
    - a protective cover coupled to the gap pad such that the gap pad is sandwiched between the plate and the protective cover; and
- a cold plate thermally coupled to the receptacle.

12. The system of claim 11, wherein the gap pad of the at least one cooling interface module compresses upon insertion of the removably pluggable module such that a thermal connection is created between the receptacle and the removably pluggable module.

13. The system of claim 12, wherein the removably pluggable module compresses the gap pad by pushing the protective cover away from the removably pluggable module as the removably pluggable module is inserted into the receptacle.

14. The system of claim 13, wherein contact between the gap pad and the receptacle, between the gap pad and the protective cover, and between the protective cover and the removably pluggable module creates a thermal interface between the removably pluggable module and the receptacle.

15. The system of claim 12, wherein:
- insertion of the removably pluggable module results in compression of the gap pad; and the protective cover is pushed against the removably pluggable module by a restoring force caused by compression of the gap pad.

16. The system of claim 11, wherein the cold plate is directly coupled to the receptacle.

17. The system of claim 11, wherein:

the cold plate is a remotely located cold plate; and the receptacle is thermally coupled to the remotely located cold plate by one or more thermal transfer devices.

18. The system of claim 11, wherein the protective covering is a stainless steel covering.

19. A method comprising:

inserting a removably pluggable module into a receptacle of a computing system, the receptacle comprising:

a cage defining a bay into which the removably pluggable module is inserted; and a cooling interface module attached to the cage;

during the inserting, contacting the removably pluggable module with a protective cover of the cooling interface module;

by the contacting, compressing a gap pad of the cooling interface module between the protective cover and a plate of the cage, wherein the gap pad is attached to the protective cover; and thermally coupling the removably pluggable module to the receptacle by causing the gap pad to, in response to being compressed, push the protective cover against the removably pluggable module.

20. The method of claim 19, wherein:

the receptacle is thermally coupled to a cold plate of the computing system; and thermally coupling the removably pluggable module to the receptacle comprises thermally coupling the removably pluggable module to the cold plate.

* * * * *